United States Patent [19]

Schwuttke

[11] 3,821,038

[45] June 28, 1974

[54] METHOD FOR FABRICATING SEMICONDUCTOR STRUCTURES WITH MINIMUM CRYSTALLOGRAPHIC DEFECTS

[75] Inventor: Guenter Helmut Schwuttke, Poughkeepsie, N.Y.

[73] Assignee: International Business Machines Corporation, Armonk, N.Y.

[22] Filed: May 22, 1972

[21] Appl. No.: 255,468

[52] U.S. Cl. .................. 148/186, 148/1.5, 148/187, 148/188, 148/189, 252/62.3 E, 29/576, 117/201

[51] Int. Cl. ............................................ H01l 7/44

[58] Field of Search ........... 148/186, 187, 188, 189, 148/1.5, 175; 252/62.3 E, 62.3 GA; 29/576

[56] References Cited

UNITED STATES PATENTS

| | | | |
|---|---|---|---|
| 3,442,725 | 5/1969 | Huffman et al. | 148/189 |
| 3,644,154 | 2/1972 | Hoogendoorn et al. | 147/187 |
| 3,664,893 | 5/1972 | Frazee | 148/175 |

OTHER PUBLICATIONS

"The Bell System Technical Journal," Vol. 39, pp. 208, 210 (Jan., 1960).

"I.B.M. Technical Disclosure Bulletin," Vol. 9, No. 11, (April, 1967), p. 1650.

*Primary Examiner*—G. T. Ozaki

*Attorney, Agent, or Firm*—Daniel E. Igo; J. B. Kraft

[57] ABSTRACT

A method for manufacturing semiconductor bipolar devices and structures comprising carrying out processing steps such as diffusion, reoxidation, epitaxial deposition, isolation and similar process steps, at a processing temperature range in which the conductivity dopant or impurity exhibits maximum solubility in the semiconductor material thereby minimizing crystallographic dislocations which render subsequent device structures defective.

5 Claims, 6 Drawing Figures

METHOD FOR FABRICATING SEMICONDUCTOR STRUCTURES WITH MINIMUM CRYSTALLOGRAPHIC DEFECTS

BACKGROUND OF THE INVENTION

1. Field of the Invention

The present invention relates to an improved method for forming planar semiconductor structures by diffusion of conductivity determining impurities into the surface of semiconductor wafers through openings in a mask of insulating materials. The continued miniaturization of semiconductor structures such as devices and integrated circuits is fundamental to major advances in the microelectronics art. This miniaturization aims to achieve lower fabrication cost, greater component density and increased component reliability. The increasing density of circuit elements and devices on a given wafer greatly magnifies the problem or deficiency of crystallographic defects such as "pipes" and other process induced dislocations which, in turn, greatly affect the yield, quality, reliability and similar process parameters. The aforesaid defects were believed to have been caused primarily by dislocations in the crystals caused by thermally induced strains resulting from the heating of the wafer and mechanical handling of the slice during processing. When the chips to be formed from the wafer contained after discrete devices or simple integrated circuits with relatively few devices and circuit elements, it is not critical that the dislocation problem be controlled. This is due to the fact that if dislocations in certain areas of the wafers render some of the chips inoperative, there is still sufficient number of unaffected chips available for use in areas without dislocations and the resultant loss in yield though significant, does not become critical. However, with integrated circuits of increasing device density on wafers to be divided into individual chips having hundreds of components, the problem becomes more significant and whenever a crystallographic defect renders a chip inoperative, a complex integrated circuit with hundreds of elements would thereby be rendered inoperative.

The trend in the art has been, and is continuing, in the direction of smaller discrete devices or circuit elements on larger chips containing integrated circuits having increasing numbers of devices. Consequently, in order to lower production costs and to efficiently accommodate larger chips, the diameters of wafers have been increasing which further magnifies the criticality of the crystallographic dislocation problem, especially as it results to process yield.

2. Description of the Prior Art

Heretofore, it was believed that the primary cause of crystallographic defects such as dislocations in wafers was caused by the application of high heat in excess of 1,100°C, especially where such applications or process conditions were undertaken for several hours. In the surface oxidation and diffusion steps of conventional planar semiconductor structure fabrication, particular attention has been directed to the mounting of wafers in the holder. During the diffusion and oxidation processing steps considerable discussion of these considerations is found in U.S. Pat. No. 3,644,154 issued Feb. 22, 1972, wherein crystallographic defects are minimized during such high temperature oxidation and diffusion steps by maintaining the wafer in a position wherein at least one entire surface of the wafer is less than one quarter inch from the substrate, having a heat capacity of at least 10 times that of the wafer. Similarly, uniform cooling and utilization of apparatus to effectuate uniform cooling from high temperature processing has assisted in decreasing the crystallographic defects of semiconductor wafer materials. Pending application Ser. No. 185,652 entitled "A Method for Reducing Crystallographic Defects in Semiconductor Structures" and filed Oct. 1, 1971, now U.S. Pat. No. 3,737,282, discloses a method for fabricating semiconductor structures, wafers and devices with reduced thermally induced crystallographic defects comprising supporting said wafers in close proximity to one another, heating said wafers to an elevated temperature, maintaining a uniform circumferential heat mass surrounding said wafers and immediately withdrawing said material from the heating zone and symmetrically cooling the previously heated semiconductor wafers.

SUMMARY OF THE INVENTION

Accordingly, it is the primary object of the present invention to provide a method of fabricating planar semiconductor structures in which crystallographic defects are minimized.

It is a further object of this invention to provide a method for minimizing crystallographic defects in monolithic integrated semiconductor structures.

It is a further object of this invention to provide a method for minimizing crystallographic defects in planar semiconductor structures in devices resulting from fabrication steps involving oxidation and diffusion and similar process steps, at temperature conditions which are relatively constant and not cyclical in nature.

It is still a further object of this invention to provide a method for manufacturing semiconductor structures whereby conductivity dopant precipitation is minimized which, in turn, eliminates crystallographic lattice strains and stresses induced by dopant precipitation.

It is still a further object of this invention to provide a method for the manufacture of semiconductor structures and devices whereby improved yields and cost reduction is accomplished through crystallographic defect elimination.

The foregoing and other objects, features and advantages of the invention will be more apparent and further understood from the following more particular description and illustrations of the preferred embodiments wherein the aforesaid objects are accomplished by providing a method for manufacturing semiconductor bipolar devices and structures which comprises the carrying of the processing steps such as diffusion, reoxidation, epitaxial deposition, isolation and similar process steps between a temperature range where the conductivity dopant or impurity exhibits maximum solubility in the semiconductor material thereby minimizing crystallographic dislocations which render subsequent device structures defective and often inoperative.

DESCRIPTION OF THE PREFERRED EMBODIMENTS

Figure 1:
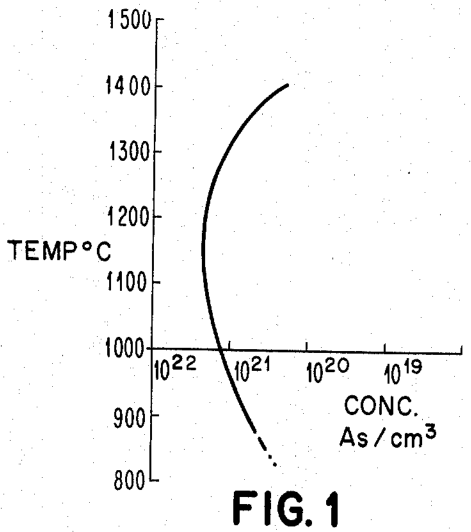
FIG. 1 is an illustrative plot of the solid solubility of arsenic in silicon at temperatures between 800°C and 1,400°C.

In order to appropriately illustrate the principles of the present invention, it should be understood that conductivity dopants such as arsenic, phosphorous, boron and the like, exhibit maximum solid solubility in a semiconductor material such as silicon or germanium between certain temperature parameters. This is more specifically illustrated by FIG. 1 which shows a plot and illustrates a profile of the solid solubility of arsenic in silicon over a temperature range of approximately 800° to 1,400°C. Similar plots are well-known in the art and demonstrate solubility properties of such dopants as arsenic, boron, phosphorous, lead, tin, aluminum, lithium, gallium, gold, copper, cobalt, magnesium and the like, in silicon.

Similarly, it should be recognized that the planar fabrication technique is believed to be the most commonly utilized semiconductor device process at present. It involves a series of successive formations of insulating masks on the surface of a semiconductor wafer and diffusions of conductivity-determining impurities through the said masks to form emitter, collector base, subcollector and similar diffused regions. The wafer is then cut into chips containing either discrete devices or integrated circuits.

Referring to the drawings in practicing the planar semiconductor fabrication technique which involves a series of process steps or formation of insulating masks on the surface of the semiconductor wafer and diffusions of conductivity-determining impurities through the mask openings at elevated temperatures, impurities or dopants such as arsenic, boron, phosphorous and the like, are usually used to produce PN junction structures and devices.

Generally speaking, semiconductor planar technology involves a series of diffusion and film deposition procedures to produce a subcollector region which is followed by the deposition of an epitaxial layer thereon and the formation of the base emitter and often followed by a reach-through diffusion step or steps. Intermittently between the aforesaid process steps, drive-in or reoxidation techniques are followed depending upon the dopant impurity and the particular structure of the device desired. The aforesaid process steps are usually carried out under varied temperature conditions ranging from approximately 1,200°C to approximately 800°C with intermittent cooling to room temperature during processing.

It is well known to form subcollector diffusions with, for example, arsenic at 1,100°C in a closed tube for a period of sixteen hours. Customarily, after diffusions of this nature and removal from the diffusion furnace, the wafers are cooled to room temperature prior to subsequent reoxidation or epitaxial deposition steps which are usually carried out at temperatures between 950° to 1,175°C. During planar technology practice, it should be pointed out that subcollector diffusions at approximately 1,100°C are followed by a reoxidation at approximately 970°C. The epitaxial depositions are usually processed at 1,170°C followed by an epitaxial reoxidation at 970°C. Intermittent to these process steps, the wafers are cooled to room temperature of approximately 25°C. It is not unusual to form isolation structures at 1,100°C followed by a reoxidation or a drive-in step at a temperature of about 950°C. Again, intermittent to which the wafer is cooled to room temperature.

In integrated structures using PN junction isolation techniques to isolate active devices, it is necessary to apply a negative potential to a P-type isolating region or a positive potential to an N-type isolating region to create the essential reverse bias condition for isolation. It is, therefore, important to provide a connector that is electrically isolated from the isolating region of the integrated structure in such a manner as to permit the connector voltage to be at a potential value that can be either below or above the potentials applied to the isolation region. Furthermore, the conductor should occupy as small a planar area as possible, thereby reducing the amount of semiconductor area required therefor, and this will also result in the reduction in capacitance thereby increasing the figure of merit. Similarly, it is important to produce junctions of the same or different conductivity type diffused areas without leakage or shorts between regions.

In the formation of underpass connectors, for example, it is essential to prevent possible shorting of the connector region to the region of the same conductivity as the connector. Accordingly, the use of a connector formed by either a base or emitter diffusion or a combination of both diffusions in an epitaxial region does not provide a good connector because the resistivity value is usually above what is needed to provide optimum conducting properties and furthermore, since the connector region is formed by a diffusion operation, this could result in "pipes" being formed which would create shorting to a region of the same conductivity type as the connector. "Pipes" is a term in the art referring to channels of diffused material formed usually in fault areas of semiconductor structures which reach undesired regions in the structure. These faults are believed to be caused by dislocations and impurity precipitations.

The art regards the primary subcollector diffusion as critical in that it is a well known practice to heavily dope the semiconductor material to a relatively high doping concentration. In most cases, this is carried out to the limit of the solid solubility of the dopant in the semiconductor material.

Figure 2:
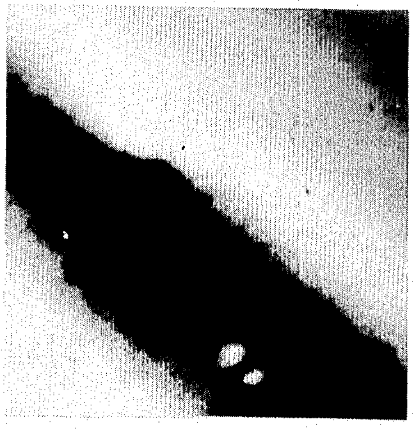
FIG. 2 is a transmission electron microscopy micrograph of a silicon wafer after subjection to customary arsenic subcollector diffusion at 1,105°C for sixteen hours and cooled to room temperature of approximately 25°C.

It has been found in the practice of planar semiconductor technology that the original formation, for example, a subcollector region by the diffusion of arsenic in silicon at a temperature of approximately 1,100°C to 1,150°C and followed by a cooling to room temperature. A wafer condition is formed as shown in FIG. 2.

Figure 3:
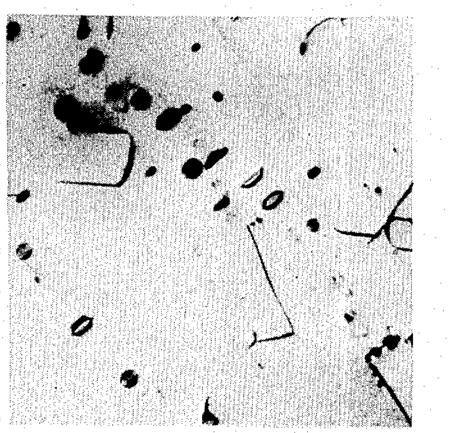
FIG. 3 is a transmission electron microscopy micrograph of the wafer shown in FIG. 2 after a reoxidation heating to 900°C for five hours and cooled to room temperature of about 25°C.

The subsequent reoxidation or drive-in step is usually carried out at a temperature of between 950° to 970°C. This temperature range is obviously below the maximum solubility temperature range of arsenic in silicon as illustrated in the curve of FIG. 1. This condition causes inter-lattice impurity precipitation and in this case, arsenic precipitates as illustrated in FIG. 3. The octogonal shaped regions are inter-latticed arsenic precipitates. Upon cooling the wafer to room temperature prior to subsequent processing, the arsenic precipitates cause inter-lattice strains and stresses which result in dislocations and imperfections which provide voids for the lodging of precipitate particles therein. It is the precipitated impurities in the inter-lattice structure that causes dislocations or crystallographic imperfections due to inter-lattice stress and strains which result in inoperative devices resulting from shorting conditions between conductivity doping regions.

Figure 4:
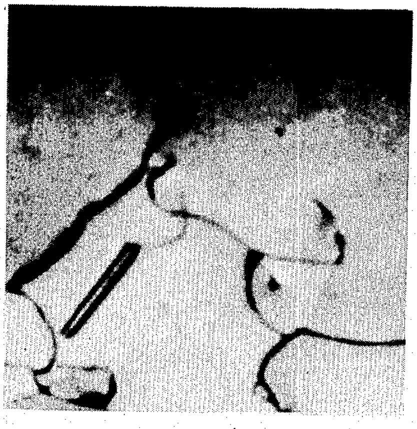
FIG. 4 is a transmission electron microscopy micrograph of the same wafer illustrated in FIGS. 2 and 3 and reheated to a temperature of 1,100°C for 1 hour and cooled to room temperature of approximately 25°C.

It will be observed as shown in FIG. 4 that upon heating to the original subcollector diffusion temperature of approximately 1,100°C, the precipitate is dissolved within the crystal lattice because of the maximum solubility range, the nevertheless the crystallographic dislocations or imperfections formed by the inter-lattice precipitate do not disappear at this elevated temperature. Therefore, once inter-lattice precipitates cause crystallographic dislocations, the dislocations are not removed by subsequent annealing at original diffusion temperatures. In effect, the dislocations become permanent crystal imperfections.

Further, it has been observed in the case of arsenic in silicon diffusions, the formation of silicon arsenide precipitates in the form of rhombic and monoclinic forms. The high temperature annealing may redissolve the rhombic form but the monoclinic remains permanently lodged within the previously formed dislocations and imperfections.

Figure 5:
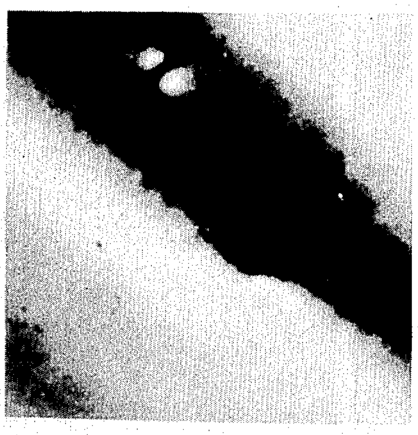
FIG. 5 is a transmission electron microscopy micrograph of another silicon wafer subjected to a standard arsenic sub-collector diffusion for sixteen hours at 1,110°C, and cooled to room temperature of about 25°C.
Figure 6:
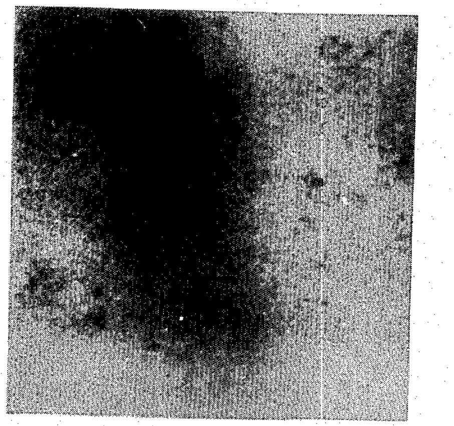
FIG. 6 is a transmission electron microscopy micrograph of the wafer illustrated in FIG. 5 after reheating to 1,100°C for one hour and cooling to room temperature of approximately 25°C.

This invention provides a planar semiconductor method which comprises forming all planar processing steps between a temperature range which is the maximum solubility temperature condition for the dopant impurity in the semiconductor material. The solid solubility of various dopants in semiconductor materials is explained and disclosed in Bell System's Technology, Technical Journal, Vol. 39, page 205, 1960 by F. A. Trumbore. FIG. 5 is a transmission electron microscopy micrograph of a silicon wafer subjected to an 1,100°C subcollector arsenic diffusion for approximately sixteen hours and cooled to room temperature while FIG. 6 is the same silicon wafer reheated to 1,100°C for one hour and cooled to room temperature. The transmission electron microscopy micrograph clearly illustrates the absence of crystallographic dislocations, imperfection and inter-lattice precipitate particles.

The solid solubility characteristics of various materials in silicon relative to temperature and concentration conditions are well known in the art. Such materials as phosphorous, arsenic, boron, gallium, antimony, aluminum, tin, lead, copper, bismuth, gold, zinc, manganese and cobalt and others have been reported.

While the invention has been particularly shown and described with reference to preferred embodiments thereof, it will be understood by those skilled in the art that the foregoing and other changes in form and detail may be made therein without departing from the spirit and scope of the invention.

I claim:

1. In the method for manufacturing planar semiconductor structures and devices which requires high heat steps at temperatures in excess of 800°C, the improvement comprising conducting all such high heat steps carried out simultaneously with or subsequent to the introduction of impurity dopant into the semiconductor structure within temperature ranges which substantially allow maximum solid solubility of impurity dopant in the semiconductor material.

2. A method in accordance with claim 1 wherein said impurity dopant is selected from the group consisting of arsenic, boron and phosphorous.

3. A method in accordance with claim 1 wherein said semiconductor material is selected from the group consisting of silicon and germanium.

4. A method in accordance with claim 1 wherein the said impurity dopant is arsenic.

5. A method in accordance with claim 4 wherein said substrate is silicon and said temperature range is between 1,075°C and 1,150°C.

* * * * *